US006831365B1

(12) United States Patent
Yao et al.

(10) Patent No.: US 6,831,365 B1
(45) Date of Patent: Dec. 14, 2004

(54) METHOD AND PATTERN FOR REDUCING INTERCONNECT FAILURES

(75) Inventors: Chih-Hsiang Yao, Taipei (TW); Wen-Kai Wan, Hsinchu (TW); Tai-Chun Huang, Kaohsiung (TW); Chin-Chiu Hsia, Taipei (TW)

(73) Assignee: Taiwan Semiconductor Manufacturing, Co., Hsin-Chu (TW)

( * ) Notice: Subject to any disclaimer, the term of this patent is extended or adjusted under 35 U.S.C. 154(b) by 0 days.

(21) Appl. No.: 10/448,656

(22) Filed: May 30, 2003

(51) Int. Cl.⁷ ............................................. H01L 23/48
(52) U.S. Cl. ........................ 257/758; 257/767; 257/773; 257/774; 257/775
(58) Field of Search ............................. 257/758, 767, 257/773–775

(56) References Cited

U.S. PATENT DOCUMENTS 5,506,450 A * 4/1996 Lee et al. ................... 257/767
6,329,719 B1 * 12/2001 Nakamura ................... 257/773
6,417,572 B1 * 7/2002 Chidambarrao et al. ..... 257/773
6,650,010 B2 * 11/2003 Davis et al. ................. 257/700

* cited by examiner

Primary Examiner—Tom Thomas
Assistant Examiner—Matthew E. Warren
(74) Attorney, Agent, or Firm—Timothy J. Keefer; Seyfarth Shaw LLP

(57) ABSTRACT

A method and a pattern for reducing interconnect failures are described. The method and pattern are used for a multilevel structure of metal/dielectric/metal. At least one assistant pattern is attached to one metal layer of the multilevel structure. A thermal stress gradient resulting from the assistant pattern can collect vacancies of the metal layer, so as to prevent stress-induced voids from generating at the bottom of a via plug which connects the two metal layers.

17 Claims, 6 Drawing Sheets

METHOD AND PATTERN FOR REDUCING INTERCONNECT FAILURES

BACKGROUND OF THE INVENTION

1. Field of Invention

The present invention relates to semiconductor structure and process. More particularly, the present invention relates to a method and pattern for reducing interconnect failures.

2. Description of Related Art

An integrated circuit is formed with many electronic elements and circuits shrunk on a microchip. High-density integrated circuits, such as very large scale integration (VLSI) circuits, are typically formed with two or more metal wires serving as multilevel structures to comply with a very high density of devices.

Interconnect structures, such as via plugs, connect the metal wires of the multilevel structure to form a complete circuit. The isolation structures in the metal wires are achieved by the formation of an inter-metal dielectric (IMD) layer. Recently, a process of fabricating the multilevel interconnect structure which forms the metal wire and the via plug at the same time has been developed, and is called a dual damascene process.

Aluminum (Al) is a commonly used conductive material for connecting various devices in the conventional semiconductor process because of its high conductivity, low price, and facility of deposition and etching. As the integrated density increases, the capacitance effect between the metal wires increases. Consequently, the resistance-capacitance time delay (RC delay time) increases, and cross talk between the metal wires becomes more frequent. The metal wire thus carries a current flow at a slower speed.

In the various factors, the inherent resistance of a metal wire and parasitic capacitance between two metal wires are crucial factors for determining the speed of the current flow. The parasitic capacitance can be reduced by insulating metal wiring layers with low k (dielectric constant) materials, the dielectric constants thereof being generally lower than 3.5. To achieve the reduction of the resistances of metal wires, materials with low resistances are selected for fabricating the metal wires. Copper (Cu) having a relatively high melting point, low resistance (about 1.7 $\mu\Omega$-cm) and high anti electro-migration ability gradually has become the new material of choice for replacing aluminum.

FIG. 1A illustrates a schematic view of a conventional via plug structure between two metal layers. The via plug structure 100 is a metal layer/dielectric layer/metal layer structure. A metal layer 104 having a line extension attached thereto is connected to a metal layer 108 by a via plug 108. FIG. 1B illustrates a partial side view of FIG. 1A. The other portions of the two metal layers 104 and 106 are insulated by a dielectric layer 102 as illustrated in FIG. 1B.

However, it is hard to avoid formation of some vacancies on the edges of grains of the metal layer 104 as the metal layer 104 is formed. As a result of a stress gradient, the vacancies are driven to pass through the line extension 104a, and collect at the bottom of the via plug 108, named via plug bottom 112, so as to form stress-induced voids (SIVs). The SIV is at the via plug bottom 112 and causes the via plug 108 to be interrupted, thereby generating interconnect failures.

The SIV formation mechanism is usually explained as vacancies in the metal layer being driven by the thermal stress gradient to a certain area to form voids. The thermnal stress gradient results from the stress variations of different areas with different thermal expansion constants. For an integrated circuit, the variations of temperature during processing or operating, and the mismatching of different materials, generally generate a thermal stress gradient.

For example, when there are wires with different widths in the metal layers, such as the metal layers 104 and the line extension 104a in FIG. 1A, a thermal stress gradient is generated due to their different area dimensions as their temperatures are varying. The voids resulting from the thermal stress gradient especially tend to form at the via plug bottom 112, because the via plug bottom 112 is the lowest stress area. Thus the via plug 108 is interrupted.

SUMMARY OF THE INVENTION

It is therefore an objective of the present invention to provide method and pattern for reducing interconnect failures, which satisfies the need to avoid the via plug bottom being interrupted by voids.

In accordance with the foregoing and other objectives of the present invention, a method and a pattern for reducing the interconnect failures are described. At least one assistant pattern, such as a 2-D dummy line extension or a 3-D dummy via plug, is attached to one metal layer of the multilevel structure. A thermal stress gradient resulting from the assistant pattern can collect vacancies of the metal layer, so as to prevent stress-induced voids from being generated at the bottom of a via plug which connects the two metal layers.

When a via plug connects one metal layer and a line extension attached to the other metal layer, the invention improves the interconnect structure by imposing at least one turning corner upon the line extension, the turning corner being located between the other metal layer and the via plug. The turning corner is the high stress area and prevents the vacancies of the other metal layer from being driven to the line extension, therefore keeping the via plug bottom from being interrupted.

In one preferred embodiments of the present inventions, a material of the two metal layers, the via plug and the assistant pattern is copper, and a material of the dielectric layer is a low k material.

A higher quantity of assistant pattern has a greater ability of dissipating vacancies to prevent the voids from being generated at the via plug bottom. Additionally, if the assistant pattern is nearer the line extension, the probability of sharing the vacancies is higher and the effect of preventing the voids from being generated at the via plug bottom is therefore also better.

Besides, the dummy via plug is not located at the line extension or the junction of the line extension and the metal layer. If it were, the vacancies gathered by the dummy via plug would form voids, and then the line extension or the junction would be interrupted, resulting in the metal layer being interrupted.

In another preferred embodiment of the invention, a turning corner is imposed upon the line extension attached to the metal layer. The turning corner is located between the metal layer and the via plug. The angle of the turning corner is 90 degrees, but other turning corners with other degrees that are high stress areas are also applicable in the present invention.

In addition, more than one turning corner can be used. Multiple turning corners imposed upon the line extension improve void prevention at the via plug bottom.

In conclusion, the dummy line extensions and the dummy vias not only reduce the area dimension having a local stress gradient, called an effective vacancy diffusion area, that drives the vacancies towards the via plug bottom, but also share the vacancies and diversify the destinations of the traveling vacancies.

The turning corner provides a high stress area in the line extension connecting with the via plug, which increases the stress migration incubation and reduces the probability of interconnect failures caused by the stress-induced voids. The stress migration-related interconnect reliability is thus improved.

It is to be understood that both the foregoing general description and the following detailed description are examples, and are intended to provide further explanation of the invention as claimed.

BRIEF DESCRIPTION OF THE DRAWINGS

These and other features, aspects, and advantages of the present invention will become better understood with regard to the following description, appended claims, and accompanying drawings where:

DESCRIPTION OF THE PREFERRED EMBODIMENTS

Figure 1A:
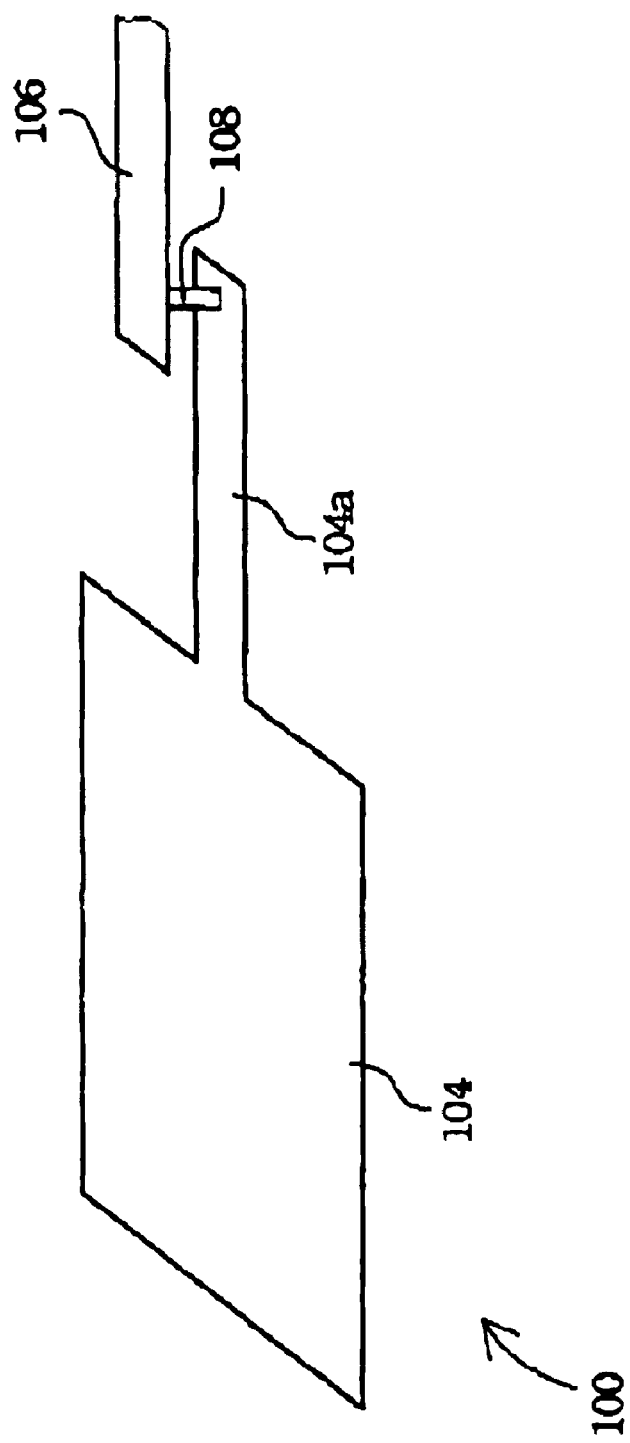
FIG. 1A illustrates a schematic view of a conventional via plug structure between two metal layers.

Reference will now be made in detail to the present preferred embodiments of the invention, examples of which are illustrated in the accompanying drawings. Wherever possible, the same reference numbers are used in the drawings and the description to refer to the same or like parts.

The present invention provides method and pattern for avoiding interruption of the via plug bottom by voids to reduce interconnect failures.

The invention is used for a multilevel structure of metal layer/dielectric layer/metal layer. At least one assistant pattern, like a 2-D dummy line extension or a 3-D dummy via plug, is attached to one metal layer of the multilevel structure. A thermal stress gradient resulting from the assistant pattern can collect vacancies of the metal layer, so as to prevent stress-induced voids from generating at the bottom of a via plug which connects the two metal layers.

When a via plug connects one metal layer and a line extension attached to the other metal layer, the invention improves the interconnect structure by imposing at least one turning corner upon the line extension, the turning corner being located between the other metal layer and the via plug. The turning corner is a high stress area and prevents the vacancies of the other metal layer from being driven to the line extension, therefore keeping the via plug bottom from being interrupted.

According to one preferred embodiment of the invention, a material of the two metal layers, the via plug, and the assistant pattern is copper, and a material of the dielectric layer is a low k material. However, the invention is also used to improve the foregoing structures when composed of other metal materials and when dielectric materials insulate the two metal layers, and thus the invention is not limited by the preferred embodiment.

Figure 1B:
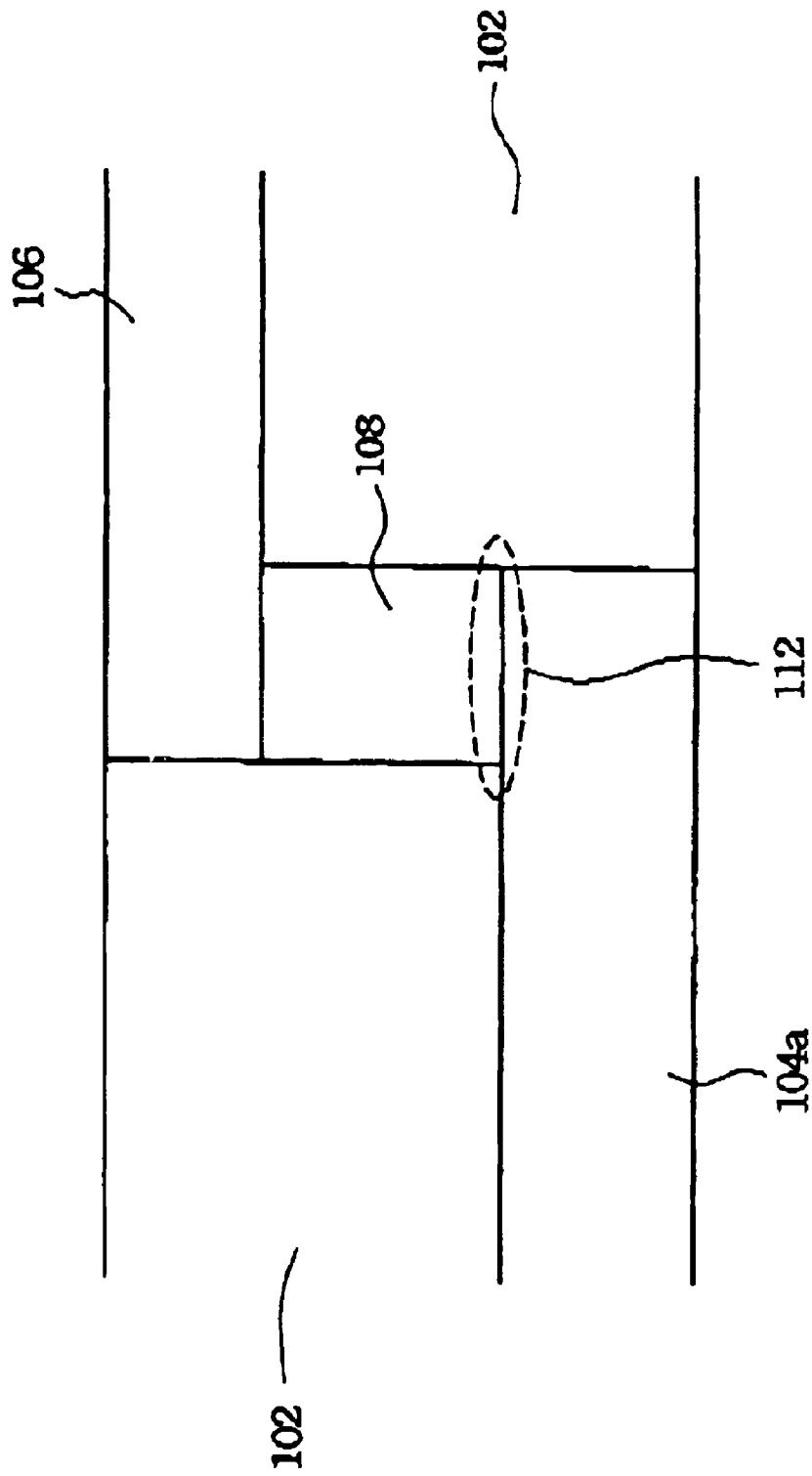
FIG. 1B illustrates a side view of FIG. 1A.
Figure 2:
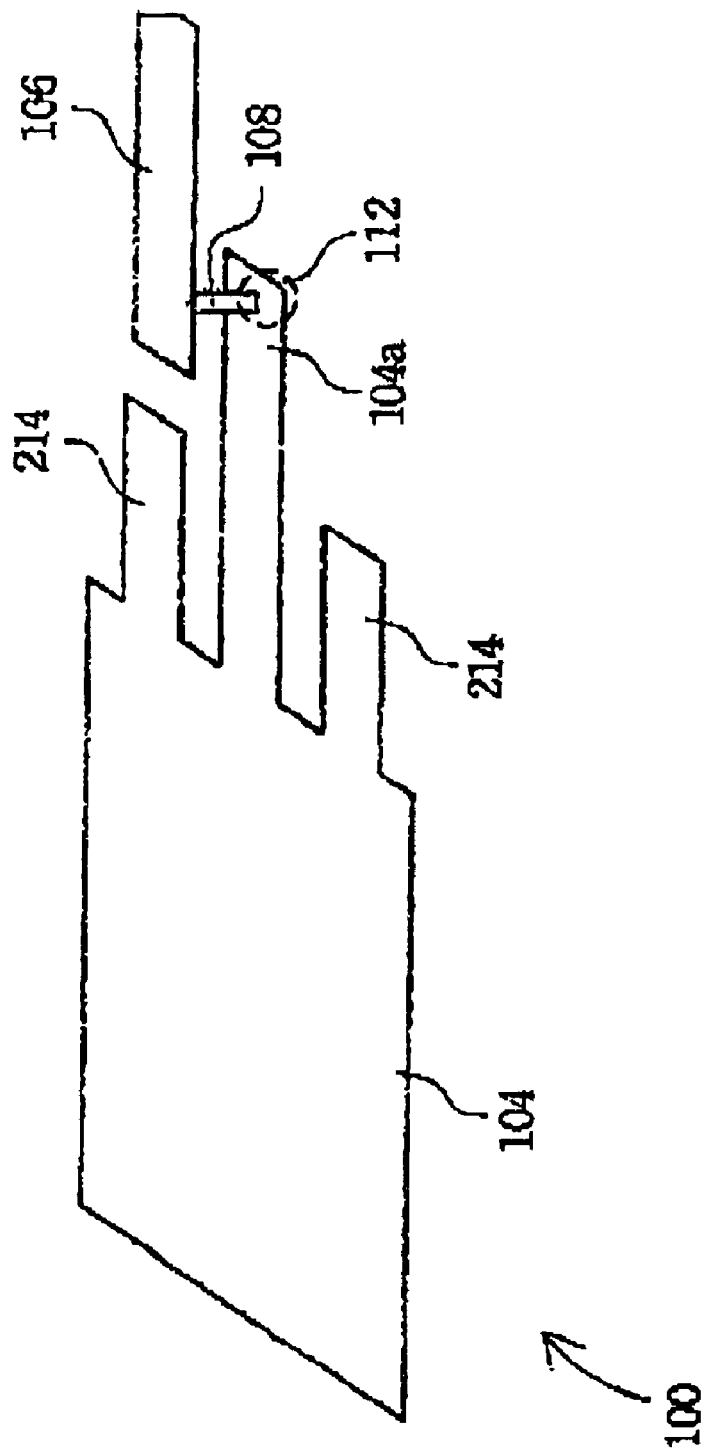
FIG. 2 illustrates a schematic view of one preferred embodiment of this invention.

FIG. 2 illustrates a schematic view of one preferred embodiment of this invention. For a clear explanation, FIG. 2 does not illustrate the dielectric layer 102 between the metal layers 104 and 106 as in FIG. 1B. In this preferred embodiment, a dummy line extension 214 is attached to the metal layer 104. The dummy line extension 214 shares the vacancies of the metal layer 104 to avoid the vacancies gathering at the via plug bottom 112 to form voids so as to interrupt the via plug 108.

A higher quantity of dummy line extensions 214 increases vacancy dissipation and thus void formation at the via plug bottom 112 is better. Besides, if the dummy line extension 214 is nearer the line extension 104a, the probability of sharing the vacancies is higher and the effect of preventing the voids from being generated at the via plug bottom 112 is also better.

Figure 3:
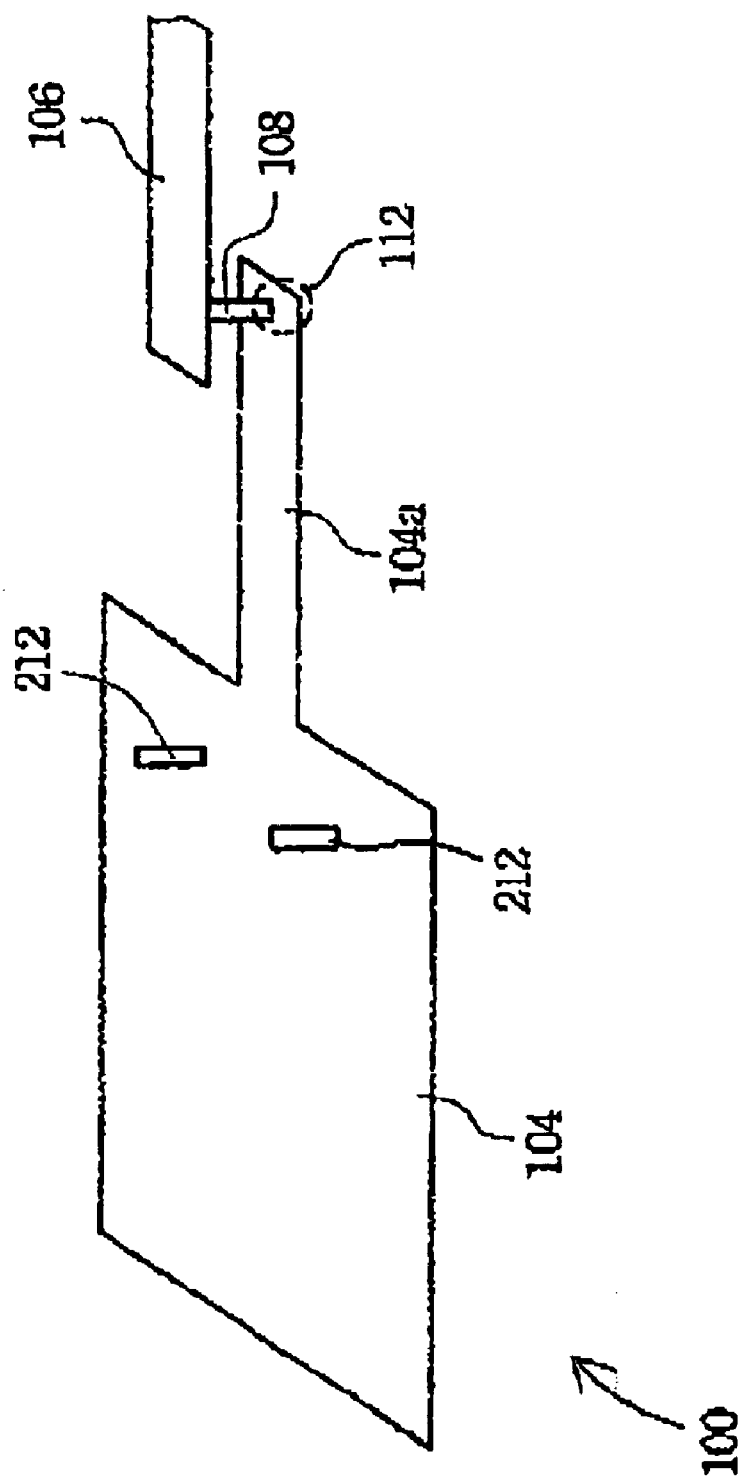
FIG. 3 illustrates a schematic view of another preferred embodiment of this invention.

FIG. 3 illustrates a schematic view of another preferred embodiment of this invention. For a clearer explanation, FIG. 3 also does not include dielectric layer 102 between the metal layers 104 and 106 as in FIG. 1. In this preferred embodiment, a dummy via plug 212 is located in the dielectric layer 102 and an end of the dummy via 212 is connected with the metal layer 104. The dummy via plug 212 shares the vacancies of the metal layer 104 to avoid vacancies gathering at the via plug bottom 112 to form voids so as to interrupt the via plug 108.

Similarly, more dummy via plugs 212 results in a greater vacancy dissipation ability and thus a better void generation prevention at the via plug bottom 112 is better. Besides, if the dummy via 212 plug is nearer the line extension 104a, the probability of sharing the vacancies is higher and the effect of preventing voids from generating at the via plug bottom 112 thus is also better.

However, the dummy via plug 212 is not located at the line extension 104a or the junction of the line extension 104a and the metal layer 104. If it were, the vacancies gathered by the dummy via plug 212 would form voids, and then interrupt the line extension 104a or the junction, thus interrupting the metal layer 104 and the metal layer 106 instead.

Figure 4A:
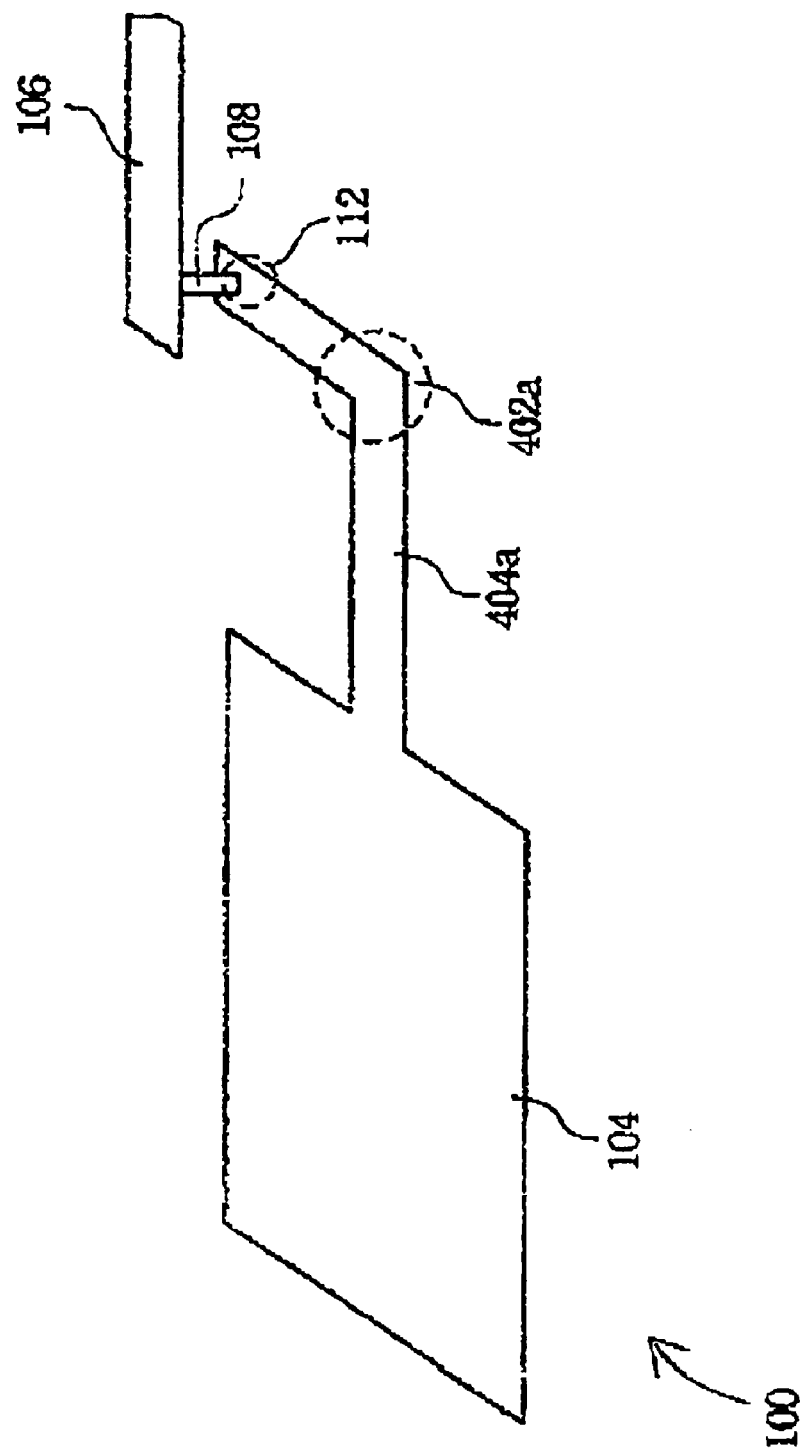
FIG. 4A illustrates a schematic view of another preferred embodiment of this invention.
Figure 4B:
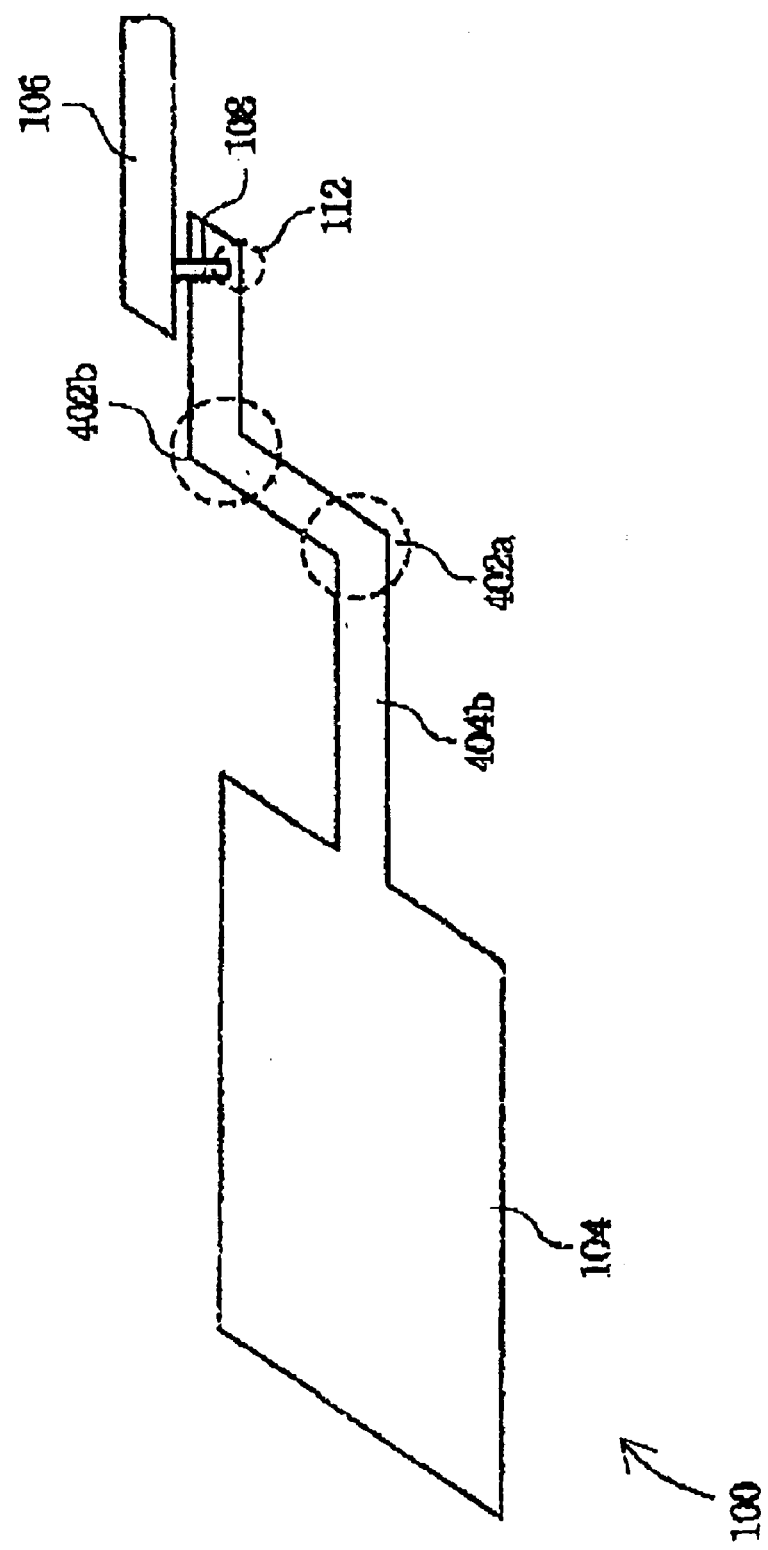
FIG. 4B illustrates a schematic view of another preferred embodiment of this invention.

FIG. 4A illustrates a schematic view of another preferred embodiment of this invention. For a clearer explanation, FIG. 4 also does not illustrate the dielectric layer 102 between the metal layers 104 and 106 as in FIG. 1B. In this preferred embodiment, a turning corner 402a is imposed upon the line extension 404a attached to the metal layer 104. The turning corner 402a is located between the metal layer 104 and the via plug 108. Because the thermal stress of the turning corner 402a is higher than that of the metal layer 104, the vacancies of the metal layer 104 are pushed back when they attempt enter the line extension 404a. The turning corner 402a prevent the vacancies of the metal layer 104 from being driven to the line extension 404a and therefore keeps the via plug 108 from being interrupted by voids.

In this preferred embodiment, the angle of the turning corner 402a is 90 degrees, but other turning corners with different degrees that are high stress areas are also applicable in the present invention, which is not limited by the embodiment. In addition, more than one turning corner can be employed, as to exemplified by turning corners 402a and 402b in FIG. 4B. Multiple turning corners imposed upon the line extension 404b improve the void generation prevention ability at the via plug bottom 112.

In one aspect, the dummy line extensions and the dummy vias not only reduce the area dimension having a local stress gradient called an effective vacancy diffusion area, that drives the vacancies towards the via plug bottom, but also share the vacancies and diversify the destinations of the traveling vacancies.

In another aspect, the turning corner provides a high stress area in the line extension connecting with the via plug, which increases the stress migration incubation and reduces the probability of interconnect failures caused by the stress-induced voids. The stress migration related interconnect reliability is thus improved.

In conclusion, the dummy line extensions and the dummy vias can share the vacancies of the metal layer, and the turning corners can prevent the vacancies from entering the line extension. The invention therefore prevents the voids from being generated at the via plug bottom to interrupt the interconnects of the metal layer/dielectric layer/metal layer/ multilevel structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pattern for reducing interconnect failures, the pattern for reducing interconnect failures comprising:
   a first metal layer;
   a second metal layer;
   a dielectric layer, between the first metal layer and the second metal layer;
   a first via plug in the dielectric layer, a first end of the first via plug is connected with the first metal layer, and a second end of the first via plug is connected with the second metal layer; and
   at least one first line extension, attached to the first metal layer, wherein when the first via plug is connected with a second line extension attached to the first metal layer, the first line extension and the second line extension are on the same side of the first metal layer, and the first line extension collects vacancies of the first metal layer to prevent the vacancies of the first metal layer from being accumulated at a bottom of the first via plug and then forming voids.

2. The pattern for reducing interconnect failures of claim 1, wherein a material of the first via plug, the first metal layer, the second metal layer, and the first line extension is copper.

3. The pattern for reducing interconnect failures of claim 1, wherein a material of the dielectric layer is a low k material.

4. A pattern for reducing interconnect failures, the pattern for reducing interconnect failures comprising:
   a first metal layer, having a line extension;
   a second metal layer;
   a dielectric layer, between the first metal layer and the second metal layer, and
   a via plug in the dielectric layer, a first end of the via plug is connected with the line extension, and a second end of the via plug is connected with the second metal layer, wherein the line extension having at least one turning corner between the first metal layer and the via plug, the turning corner avoids vacancies in the first metal layer being driven to a bottom of the via plug.

5. The pattern for reducing interconnect failures of claim 4, wherein an angle of the turning corner is 90 degrees.

6. The pattern for reducing interconnect failures of claim 4, wherein a material of the via plug, the first metal layer, the second metal layer and the line extension is copper.

7. The pattern for reducing interconnect failures of claim 4, wherein a material of the dielectric layer is a low k material.

8. In an interconnect having a first via plug to connect a first metal layer and a second metal layer, an improvement thereto comprising:
   at least one first line extension, attached to the first metal layer, wherein when the first via plug is connected with a second line extension attached to the first metal layer, the first line extension and the second line extension are on the same side of the first metal layer, and the first line extension collects vacancies of the first metal layer to prevent the vacancies of the first metal layer from being accumulated at a bottom of the first via plug and then forming voids.

9. The interconnect of claim 8, wherein a material of the first via plug, the first metal layer, the second metal layer, and the first line extension is copper.

10. In an interconnect having a via plug to connect a first metal layer and a line extension attached to a second metal layer, an improvement thereto comprising:
    the line extension having at least one turning corner between the second metal layer and the via plug, wherein the turning corner avoids vacancies in the second metal layer being driven to a bottom of the via plug.

11. The interconnect of claim 10, wherein an angle of the turning corner is 90 degrees.

12. The interconnect of claim 10, wherein a material of the via plug, the first metal layer, the second metal layer and the line extension is copper.

13. A pattern for reducing interconnect failures, the pattern for reducing interconnect failures comprising:
    a first metal layer;
    a second metal layer;
    a dielectric layer, between the first metal layer and the second metal layer;
    a first via plug in the dielectric layer, a first end of the first via plug is connected with the first metal layer, and a second end of the first via plug is connected with the second metal layer; and
    at least one second via plug in the dielectric layer, a first end of the second plug is connected with the first metal layer, wherein when the first via plug is connected to a line extension attached to the first metal layer, the first end of the second via plug is not connected to the line extension to avoid interrupting the line extension, and the second via plug collects vacancies of the first metal layer to prevent the vacancies of the first metal layer from being accumulated at a bottom of the first via plug and then forming voids.

14. The pattern for reducing interconnect failures of claim 13, wherein a material of the first via plug, the first metal layer, the second metal layer, and the second via plug is copper.

15. The pattern for reducing interconnect failures of claim 13, wherein a material of the dielectric layer is a low k material.

16. In an interconnect having a first via plug to connect a first metal layer and a second metal layer, an improvement thereto comprising:

at least one second via plug in the dielectric layer, a first end of the second plug is connected with the first metal layer, wherein when the first via plug is connected to a line extension attached to the first metal layer, the first end of the second via plug is not connected to the line extension to avoid interrupting the line extension, and the second via plug collects vacancies of the first metal layer to prevent the vacancies of the first metal layer from being accumulated at a bottom of the first via plug and then forming voids.

17. The interconnect of claim 16, wherein a material of the first via plug, the first metal layer, the second metal layer, and the second via plug is copper.

* * * * *